United States Patent
Haga et al.

(10) Patent No.: US 10,575,410 B2
(45) Date of Patent: Feb. 25, 2020

(54) ANISOTROPIC CONDUCTIVE FILM, MANUFACTURING METHOD THEREOF, AND CONNECTION STRUCTURE

(71) Applicant: DEXERIALS CORPORATION, Shinagawa-ku, Tokyo (JP)

(72) Inventors: Kenichi Haga, Kanuma (JP); Tomoyuki Ishimatsu, Utsunomiya (JP); Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/541,621

(22) PCT Filed: Jan. 5, 2016

(86) PCT No.: PCT/JP2016/050065
§ 371 (c)(1),
(2) Date: Jul. 5, 2017

(87) PCT Pub. No.: WO2016/114160
PCT Pub. Date: Jul. 21, 2016

(65) Prior Publication Data
US 2017/0359904 A1    Dec. 14, 2017

(30) Foreign Application Priority Data

Jan. 13, 2015 (JP) .................................. 2015-004592

(51) Int. Cl.
*H05K 3/32* (2006.01)
*H01B 5/16* (2006.01)
(Continued)

(52) U.S. Cl.
CPC ................ *H05K 3/323* (2013.01); *C09J 5/06* (2013.01); *C09J 7/35* (2018.01); *C09J 9/02* (2013.01);
(Continued)

(58) Field of Classification Search
None
See application file for complete search history.

(56) References Cited

U.S. PATENT DOCUMENTS

| 6,042,894 A * | 3/2000 | Goto .......................... C09J 9/02 |
| | | 427/504 |
| 2012/0156502 A1* | 6/2012 | Maejima ................. H01L 24/29 |
| | | 428/414 |

(Continued)

FOREIGN PATENT DOCUMENTS

| CN | 102859797 A | 1/2013 |
| JP | S62-123607 A | 6/1987 |

(Continued)

OTHER PUBLICATIONS

Mar. 8, 2016 Search Report issued in International Patent Application Mo. PCT/JP2016/050065.

(Continued)

*Primary Examiner* — Katie L. Hammer
(74) *Attorney, Agent, or Firm* — Oliff PLC

(57) ABSTRACT

An anisotropic conductive film includes, as conductive particles for anisotropic conductive connection, metal particles such as solder particles having on the surface an oxide film. In this anisotropic conductive film, the metal particles are contained in an insulating film and regularly arranged as viewed in a plan view. A flux is disposed to be in contact with, or in proximity to, at least one of ends of the metal particles on a front surface side of the anisotropic conductive film and a rear surface side of the anisotropic conductive film. Preferable metal particles are solder particles. Preferably, the insulating film has a structure of two layers, and the metal particles are disposed between the two layers.

3 Claims, 10 Drawing Sheets

(51) Int. Cl.
*H01B 1/22* (2006.01)
*H01L 23/00* (2006.01)
*C09J 9/02* (2006.01)
*H05K 3/34* (2006.01)
*C09J 5/06* (2006.01)
*H01R 4/04* (2006.01)
*C09J 7/35* (2018.01)
*C08K 3/08* (2006.01)

(52) U.S. Cl.
CPC ............... *H01B 1/22* (2013.01); *H01B 5/16* (2013.01); *H01L 24/29* (2013.01); *H01R 4/04* (2013.01); *H05K 3/34* (2013.01); *H05K 3/3484* (2013.01); *C08K 3/08* (2013.01); *C09J 2201/602* (2013.01); *C09J 2201/61* (2013.01); *C09J 2205/102* (2013.01); *H05K 2203/0425* (2013.01)

(56) References Cited

U.S. PATENT DOCUMENTS

| | | | | |
|---|---|---|---|---|
| 2013/0000964 | A1* | 1/2013 | Kobayashi | H01B 1/22 174/257 |
| 2013/0279118 | A1* | 10/2013 | Koyama | C09J 9/00 361/709 |

FOREIGN PATENT DOCUMENTS

| | | |
|---|---|---|
| JP | 2011-185570 A | 7/2001 |
| JP | 2003-286457 A | 10/2003 |
| JP | 2009-152160 A | 7/2009 |
| JP | 2009-535843 A | 10/2009 |
| JP | 2010-073395 A | 4/2010 |
| JP | 2011-236427 A | 11/2011 |
| JP | 2014-060150 A | 4/2014 |
| KR | 2013-0077816 A | 7/2013 |
| TW | 201140623 A | 11/2011 |
| TW | 201431674 A | 8/2014 |
| WO | 2014/030744 A1 | 2/2014 |

OTHER PUBLICATIONS

Sep. 25, 2018 Notification of Reasons for Refusal issued in Japanese Patent Application No. 2015-004592.
Jul. 18, 2018 Notification of Reasons for Refusal issued in Korean Patent Application No. 10-2017-7010334.
Aug. 3, 2018 Office Action issued in Chinese Patent Application No. 201680004593.6.
Jan. 21, 2019 Office Action issued in Korean Patent Application No. 2017-7010334.
Sep. 25, 2019 Office Action issued in Taiwanese Patent Application No. 105100669.

* cited by examiner

ANISOTROPIC CONDUCTIVE FILM, MANUFACTURING METHOD THEREOF, AND CONNECTION STRUCTURE

TECHNICAL FIELD

The present invention relates to an anisotropic conductive film in which metal particles and a flux are in contact with, or in proximity to, each other.

BACKGROUND ART

It has been proposed that an anisotropic conductive film including an insulating adhesive composition in which conductive particles containing a resin core and a nickel/gold plated layer formed on the surface of the resin core, and the like, are dispersed is used when mounting an IC chip on a substrate (Patent Literature 1). In this case, the conductive particles are squeezed between a terminal of the IC chip and a terminal of the substrate, or dig into the respective terminals thereby to ensure conduction, and the insulating adhesive composition fixes the IC chip, the substrate, and the conductive particles.

However, the conductive particles do not form a metal bond between the terminal of the IC chip and the terminal of the substrate. Therefore, there has been a problem that, when a connection structure obtained by connecting the IC chip to the substrate through the anisotropic conductive film is stored in a high-temperature and high-humidity environment, conduction reliability decreases.

To address this problem, it is considered to adopt, as conducive particles for an anisotropic conductive film, solder particles which form a metal bond with copper or the like at a temperature that is relatively low compared to metal such as copper and aluminum generally used as a terminal material of an IC chip.

CITATION LIST

Patent Literature

Patent Literature 1: Japanese Patent Application Laid-Open No. 2014-60150

SUMMARY OF INVENTION

Technical Problem

Incidentally, when connecting terminals with solder, it is generally essential to use a flux for removing an oxide film on the surface of the solder. For this reason, it is conceivable to coat the surface of solder particles with a flux. However, the solder particles coated with a flux are likely to aggregate in an insulating adhesive composition. Accordingly, there has been a problem that when an anisotropic conductive film containing such solder particles as particles for anisotropic conductive connection is used for anisotropic conductive connection, a short is likely to be caused. It is also conceivable to compatibilize or disperse a flux in an insulating adhesive composition. However, a large amount of a flux needs to be formulated in an insulating adhesive composition in order to clean up the surface of the solder particles to an intended level. Thus, there has been a problem that corrosion of a terminal caused by the flux rather proceeds. This problem is similarly raised in an anisotropic conductive film which contains, as conductive particles for anisotropic conductive connection, metal particles on which an oxide film is formed.

An object of the present invention is to solve the above-described problems associated with conventional techniques, and to be capable of suppressing occurrence of a short and achieving high conduction reliability in an anisotropic conductive film which includes, as conductive particles for anisotropic conductive connection, metal particles such as solder particles having on the surface an oxide film.

Solution to Problem

The present inventors have found that in an anisotropic conductive film which includes, as conductive particles for anisotropic conductive connection, metal particles such as solder particles having on the surface an oxide film, occurrence of a short can be suppressed by regularly arranging the metal particles as viewed in a plan view of the anisotropic conductive film, instead of dispersing the metal particles randomly in the insulating adhesive composition, and high conduction reliability can be achieved by allowing a flux to be present in the film in such a manner as to be in contact with, or in proximity to, the metal particles. Thus, the present invention has been completed.

That is, the present invention provides an anisotropic conductive film including metal particles in an insulating film, wherein the metal particles are regularly arranged as viewed in a plan view, and a flux is disposed to be in contact with, or in proximity to, at least one of ends of the metal particles on a front surface side of the anisotropic conductive film and on a rear surface side of the anisotropic conductive film.

Also, the present invention provides a manufacturing method of the above-described anisotropic conductive film, including the steps (A) to (C) of:

(A) disposing a flux on at least a bottom of concave portions of a transfer mold which has the concave portions regularly arranged;

(B) disposing metal particles in the concave portions in which the flux has been disposed; and (C) bringing an insulating film into contact with the transfer mold, in which the metal particles have been disposed, from a side of the concave portions, and heating and pressurizing them to transfer the metal particles to the insulating film. This manufacturing method preferably further includes the step of (D) thermocompression-bonding another insulating film on the surface, having the transferred metal particles, of the insulating film to which the metal particles have been transferred.

Also, the present invention provides another manufacturing method of the above-described anisotropic conductive film, including the steps of (a) to (d):

(a) disposing metal particles in concave portions of a transfer mold which has the concave portions regularly arranged;

(b) disposing a flux on the transfer mold at a surface having the concave portions in which the metal particles have been disposed;

(c) bringing an insulating film into contact with the transfer mold at the surface having the disposed flux, and heating and pressurizing them to transfer the metal particles to the insulating film; and (d) thermocompression-bonding another insulating film on the surface having the transferred metal particles of the insulating film to which the metal particles have been transferred.

Furthermore, the present invention provides a connection structure in which a first electronic component and a second electronic component are anisotropically, conductively connected by disposing the above-described anisotropic conductive film between a terminal of the first electronic component and a terminal of the second electronic component, and heating and pressurizing them.

Advantageous Effects of Invention

In the anisotropic conductive film according to the present invention which includes the metal particles in the insulating film, the metal particles are regularly arranged as viewed in a plan view. Therefore, when the anisotropic conductive film is applied for anisotropic conductive connection, occurrence of a short can be suppressed. Also, a flux is disposed to be in contact with, or in proximity to, at least one of ends of the metal particles on a front surface side of the anisotropic conductive film and a rear surface side of the anisotropic conductive film. Therefore, the oxide film on the surface of the metal particles can be removed during anisotropic conductive connection. Thus, high conduction reliability can be achieved.

DESCRIPTION OF EMBODIMENTS

<Anisotropic Conductive Film>

Hereinafter, a specific example of the present invention will be described with reference to the drawings.

Figure 1A:
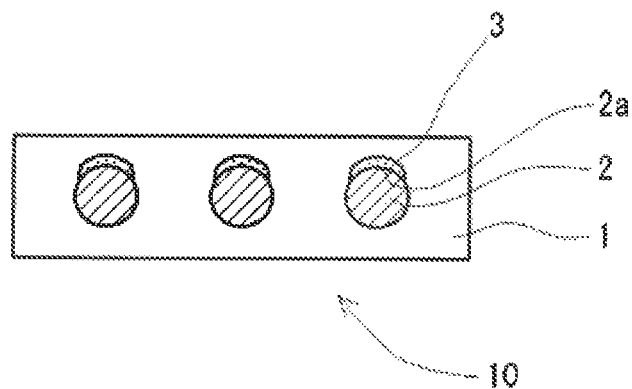
FIG. 1A is a cross-sectional view of an anisotropic conductive film according to the present invention.
Figure 1B:
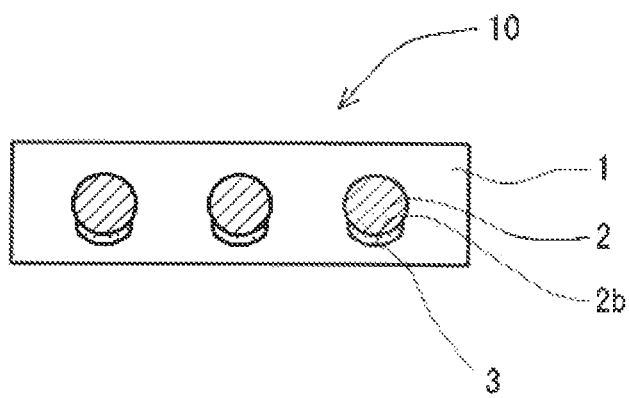
FIG. 1B is a cross-sectional view of an anisotropic conductive film according to the present invention.
Figure 1C:
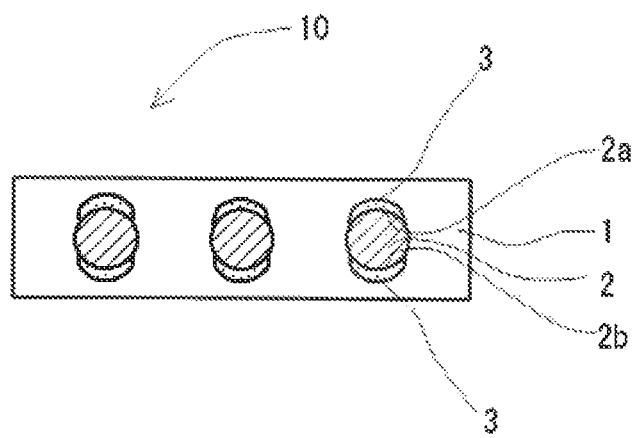
FIG. 1C is a cross-sectional view of an anisotropic conductive film according to the present invention.

As illustrated in FIGS. 1A, 1B, and 1C, an anisotropic conductive film 10 according to the present invention is an anisotropic conductive film which includes metal particles 2 in an insulating film 1. Although not illustrated in the drawings, the metal particles are regularly arranged as viewed in a plan view. Here, the regular arrangement is not particularly limited, as long as the particles are regularly arranged. Preferable examples thereof may include an orthorhombic lattice arrangement, a hexagonal lattice arrangement, a square lattice arrangement, a rectangular lattice arrangement, and a parallelotope lattice arrangement. Among these, a hexagonal lattice arrangement, which allows for the closest packing, is preferable.

As the insulating film 1, any insulating film adopted in a conventionally known anisotropic conductive film can be appropriately selected and used. Examples thereof may include a thermoplastic acryl-based or epoxy-based resin film, and a thermocurable or photocurable acryl-based or epoxy-based resin film. The thickness of such an insulating film is usually 10 to 40 µm. Also, the insulating film 1 may be in the form of a film at least when it is in the state of an anisotropic conductive film, and may be in the form of a high-viscosity liquid during the manufacture thereof.

The insulating film 1 may further include an insulating filler, such as silica fine particles, alumina, and aluminum hydroxide, if necessary. The average particle diameter of the insulating filler is preferably 0.01 to 8 µm. The content of the insulating fillers to be added is preferably 3 to 40 parts by mass relative to 100 parts by mass of a resin forming the insulating film. This facilitates provision of conduction reliability after anisotropic conductive connection.

As the metal particles 2, any metal particles which are used for anisotropic conductive connection in an anisotropic conductive film and which includes on the surface an oxide film can be appropriately selected and used. Among these, a preferable example may include solder particles of which the average particle diameter measured using an image-type particle size distribution meter is 10 to 40 µm.

In the anisotropic conductive film according to the present invention, a flux 3 is disposed to be in contact with, or in proximity to, at least one of ends of the metal particles on a front surface side of the anisotropic conductive film and a rear surface side of the anisotropic conductive film. For example, in the aspect illustrated in FIG. 1A, the flux 3 is disposed to be in contact with the ends 2a of the metal particles 2 on the front surface side of the anisotropic conductive film. In the aspect illustrated in FIG. 1B, the flux 3 is disposed to be in contact with the ends 2b of the metal particles 2 on the rear surface side of the anisotropic conductive film. In the aspect illustrated in FIG. 1C, the flux 3 is disposed to be in contact with both the ends 2a of the metal particles 2 on the front surface side of the anisotropic conductive film and the ends 2b thereof on the rear surface side of the anisotropic conductive film. When the metal particles 2 and the flux 3 are in contact with each other as illustrated in these drawings, an oxide film on the surface of the metal particles 2 is removed by the flux 3 with the heat during anisotropic conductive connection, and a metal bond is formed between the metal particles 2 and a terminal to be connected with.

The degree of the proximity between the metal particles 2 and the flux 3 means that the closest distance therebetween is less than 2 µm. When the closest distance is 2 µm or more, there is concern that contact between both could be inhibited during anisotropic conductive connection.

An example of a technique for disposing the metal particles 2 and the flux 3 such that both are in proximity to each other may include mixing a flux and insulating fillers. This is because the insulating fillers act as a spacer which causes the metal particles 2 and the flux 3 to be spaced apart from each other. Examples of such insulating fillers may include fumed silica having an average primary particle diameter of 1 to 1000 nm.

The quantitative relationship between the metal particles 2 and the flux 3 in contact with, or in proximity to, the metal particles 2 is that the thickness of the flux 3 is 0.001 to 0.4 times or less the average particle diameter of the metal particles 2. When it falls within this range, the surface of the metal particles 2 can be cleaned up, and the product obtained by anisotropic conductive connection is not corroded.

When the flux 3 is disposed in such a manner as to be in contact with, or in proximity to, the metal particles 2, a flux diluted with a solvent (preferable dilution ratio: 0.1 to 40 wt % relative to the solvent) may be applied to a transfer mold or an insulating film to which metal particles are attached, by a known application method, and then dried as necessary, as described later.

Also, the flux 3 removes an oxide film on the surface of the metal particles 2 under the heating condition during anisotropic conductive connection. As such a flux 3, any known flux can be adopted depending on the material of the metal particles 2.

Figure 2A:
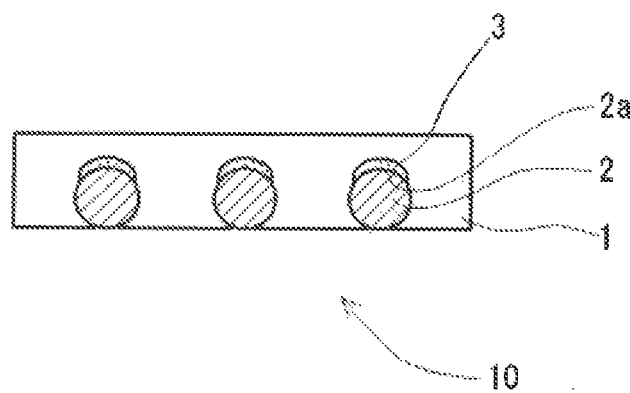
FIG. 2A is a cross-sectional view of an anisotropic conductive film according to the present invention.
Figure 2B:
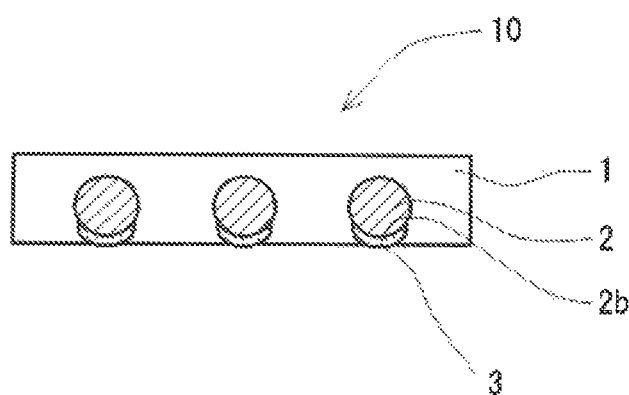
FIG. 2B is a cross-sectional view of an anisotropic conductive film according to the present invention.
Figure 2C:
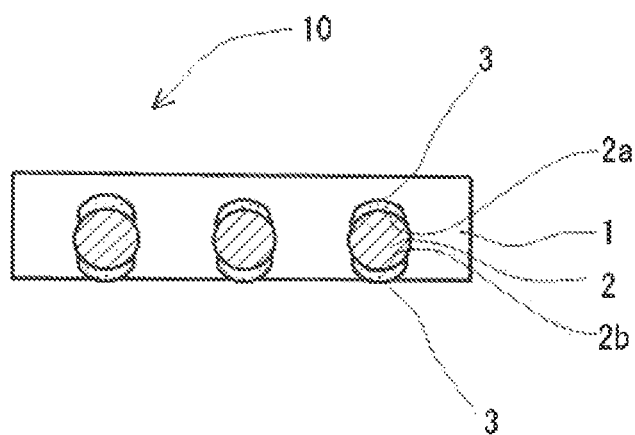
FIG. 2C is a cross-sectional view of an anisotropic conductive film according to the present invention.

In the aspects in FIG. 1A to FIG. 1C, the metal particles 2 are spaced apart from the front surface or rear surface of the insulating film 1. However, the insulating film 1 may be exposed on the front surface or the rear surface. For example, the aspect in FIG. 1A may be modified such that, as illustrated in FIG. 2A, the ends of the metal particles 2 opposite the ends 2a are exposed on the rear surface of the insulating film 1. In this case, the flux 3 is disposed to be in contact with the ends 2a. The aspect in FIG. 1B may be modified such that, as illustrated in FIG. 2B, the flux 3 which is disposed to be in contact with the ends 2b is exposed. The aspect in FIG. 1C may be modified as illustrated in FIG. 2C.

Figure 3:
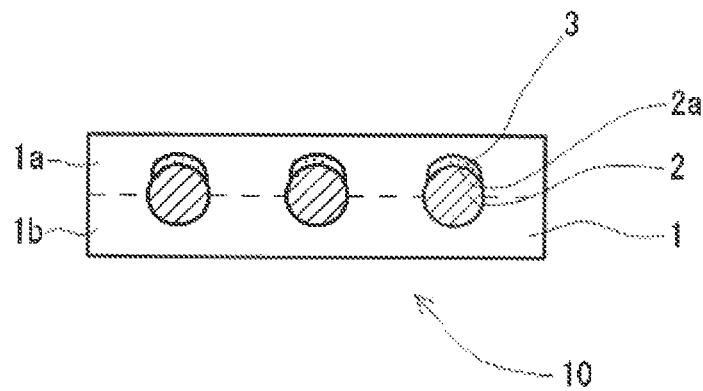
FIG. 3 is a cross-sectional view of an anisotropic conductive film according to the present invention.

In FIG. 1A to FIG. 1C and FIG. 2A to FIG. 2C, the insulating film 1 is a single layer. However, as illustrated in FIG. 3, the insulating film 1 may have a two-layer structure (1a and 1b), and the metal particles 2 may be disposed between the two layers. The use of such a two-layer structure can enhance the flexibility in manufacturing.

Figure 4:
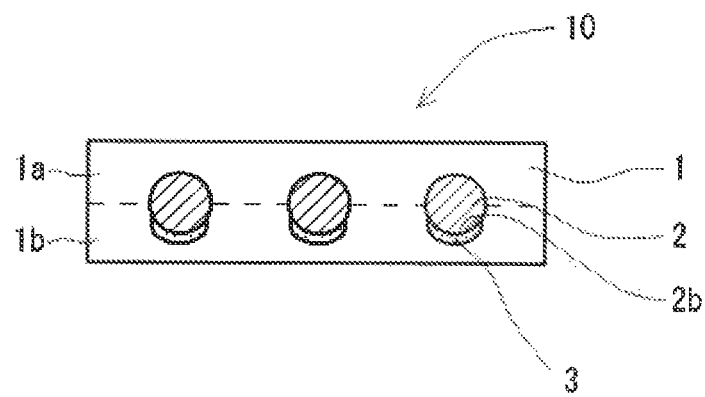
FIG. 4 is a cross-sectional view of an anisotropic conductive film according to the present invention.
Figure 5:
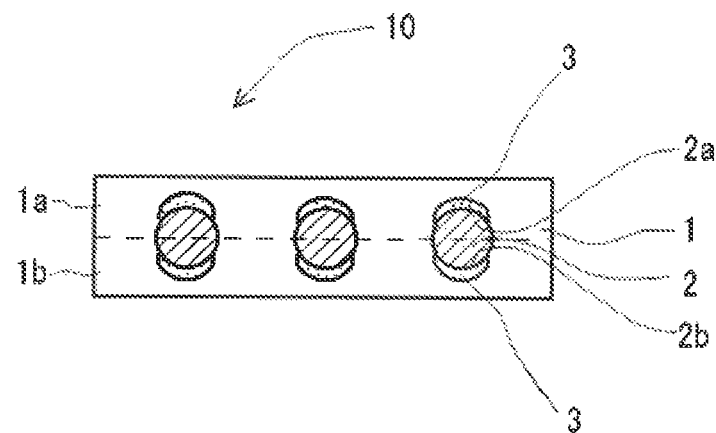
FIG. 5 is a cross-sectional view of an anisotropic conductive film according to the present invention.

Also, as illustrated in FIG. 4, the anisotropic conductive film 10 according to the present invention encompasses an aspect in which part of the surface of the metal particles 2 is not in contact with the flux 3. In FIG. 4, the surface portion of the metal particles 2 which is not in contact with the flux 3 faces the side surface direction of the film. However, the surface portion may face the front surface side or the rear surface side of the film. In particular, as illustrated in FIG. 5, it is preferable that the surface portion of the metal particles 2 which is not in contact with the flux 3 be opposite the surface portion of the metal particles which is in contact with the flux.

Figure 6:
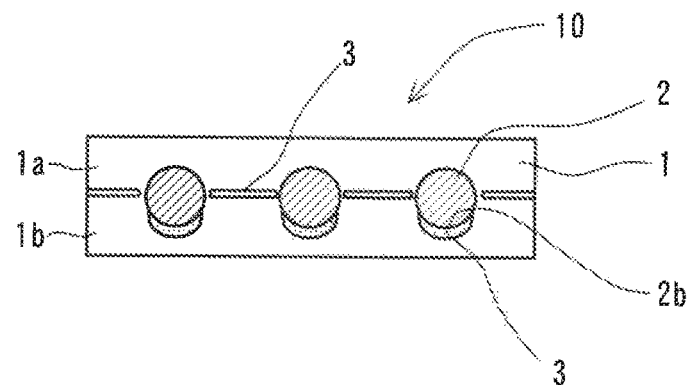
FIG. 6 is a cross-sectional view of an anisotropic conductive film according to the present invention.

Also, as illustrated in FIG. 6, the flux 3 may be disposed between the adjacent metal particles 2 in the plane direction of the anisotropic conductive film 10 according to the present invention. Such an anisotropic conductive film 10 allows the flux 3 disposed between the adjacent metal particles 2 to be attracted to the metal particles 2 during anisotropic conductive connection. Therefore, the surface of the metal particles can be cleaned up with a sufficient amount of the flux. Furthermore, interlayer peeling of the two-layer structured insulating film is not caused. In this case, it is preferable that the amount per unit area of the flux disposed to at least one of the ends 2a of the metal particles 2 on the front surface side of the anisotropic conductive film and the ends 2b on the rear surface side of the anisotropic conductive film be larger than the amount per unit area of the flux disposed between the adjacent metal particles 2.

<Manufacturing Method of Anisotropic Conductive Film>

The anisotropic conductive film according to the present invention can be manufactured by a manufacturing method which includes the following steps (A) to (C).

(Step (A))

Figure 7A:
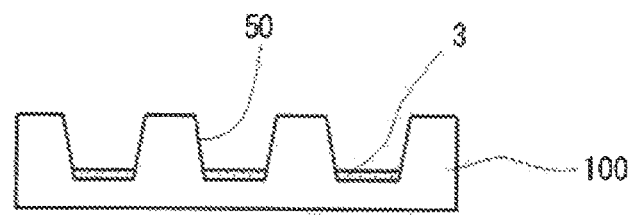
FIG. 7A is a diagram illustrating a step of a manufacturing method of the anisotropic conductive film according to the present invention.
Figure 7B:
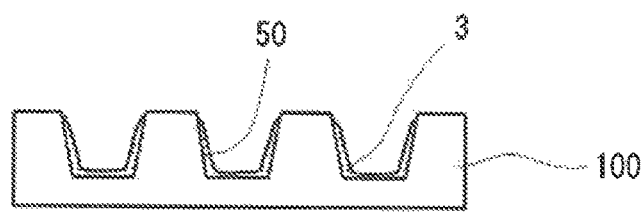
FIG. 7B is a diagram illustrating a step of the manufacturing method of the anisotropic conductive film according to the present invention.
Figure 7C:
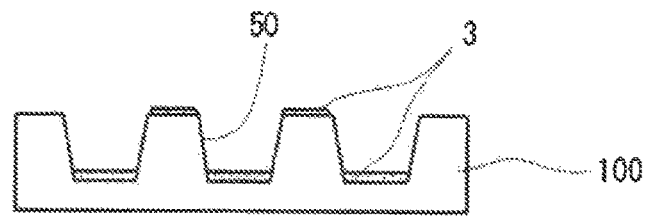
FIG. 7C is a diagram illustrating a step of the manufacturing method of the anisotropic conductive film according to the present invention.

First, as illustrated in FIG. 7A to FIG. 7C, a flux 3 is disposed on at least the bottom of concave portions 50 of a transfer mold 100 which includes the regularly arranged concave portions 50. Specifically, the flux 3 may be disposed on only the bottom of the concave portions 50 as illustrated in FIG. 7A, or may be disposed on the whole inner wall surface containing the bottom of the concave portions 50 as illustrated in FIG. 7B. Also, as illustrated in FIG. 7C, the flux 3 may be disposed on the bottom of the concave portions 50 and the surface between the adjacent concave portions 50 of the transfer body 100. In the case of FIG. 7C, it is preferable that the amount per unit area of the flux on the bottom of the concave portions 50 be larger than the amount per unit area of the flux on the surface between the adjacent concave portions 50.

As the transfer mold 100, any transfer mold prepared by a known method can be adopted. For example, a transfer body can be prepared by processing a metal plate to obtain a master, applying a curable resin composition to the master, and curing the resin composition. Specifically, a transfer mold can be obtained by cutting and processing a flat metal plate to prepare a transfer master having convex portions corresponding to concave portions, applying a curable resin composition, which is to constitute the transfer mold, to a surface having the convex portions of this master, curing the resin composition, and thereafter removing the cured resin composition from the master.

Also, as a technique for disposing the flux 3 on at least the bottom of the concave portions 50, a known technique can be adopted. For example, a flux may be applied to the whole surface of a transfer mold by a screen printing method, and the flux on the outermost surface may be scraped with a blade as necessary.

(Step (B))

Figure 8A:
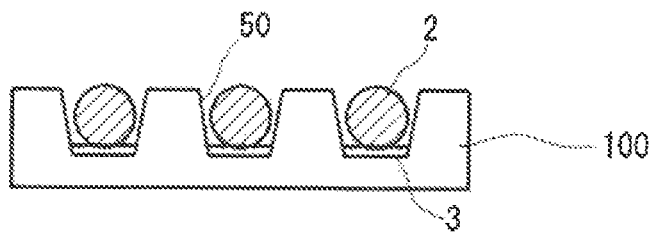
FIG. 8A is a diagram illustrating a step of the manufacturing method of the anisotropic conductive film according to the present invention.
Figure 8B:
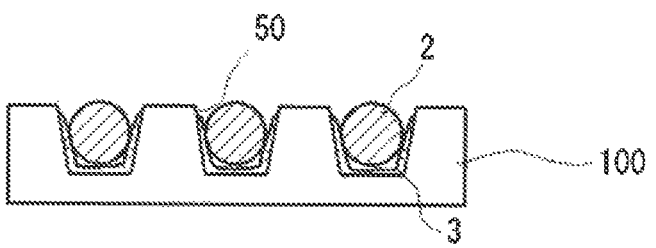
FIG. 8B is a diagram illustrating a step of the manufacturing method of the anisotropic conductive film according to the present invention.
Figure 8C:
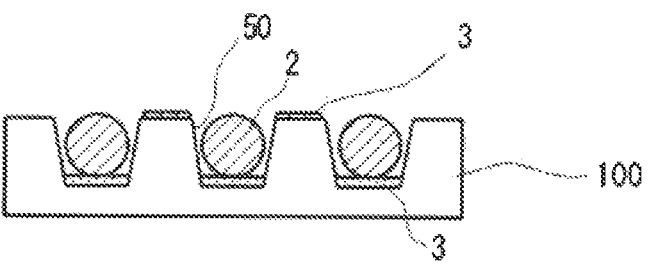
FIG. 8C is a diagram illustrating a step of the manufacturing method of the anisotropic conductive film according to the present invention.

Next, as illustrated in FIG. 8A to FIG. 8C, metal particles 2 are disposed in the concave portions 50 on which the flux 3 has been disposed. As a technique for disposing the metal particles 2, a known technique can be adopted. For example, the metal particles 2 may be disposed by dispersing metal particles on the surface of a transfer mold, and removing the metal particles present on the surface of the transfer mold other than the concave portions thereof with an air blower or a blade. Also, the metal particles may be supplied into the concave portions one by one with a microdispenser.

Figure 8D:
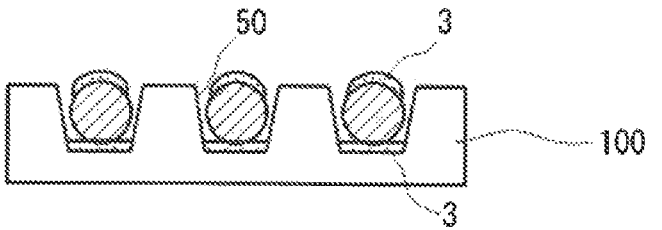
FIG. 8D is a diagram illustrating a step of the manufacturing method of the anisotropic conductive film according to the present invention.

After the metal particles have been supplied in the concave portions of the transfer mold as illustrated in FIG. 8A, the flux 3 may be disposed on the surface of the metal particles 2 by the technique of the step as illustrated in FIG. 8D.

(Step (C))

Next, as illustrated in FIG. 9A to FIG. 9D, the concave portion 50 side of the transfer mold 100 (FIG. 8A to FIG. 8D) in FIG. 8A to FIG. 8D in which the metal particles 2 have been disposed is brought into contact with an insulating film 1, and the obtained product is pressurized under heating, so that the metal particles 2 are transferred to the insulating film 1. By winding the insulating film 1 around a roll in this state, an anisotropic conductive film 10 in FIG. 10A is obtained from the aspect in FIG. 9A, an anisotropic conductive film 10 in FIG. 10B is obtained from the aspect in FIG. 9B, an anisotropic conductive film 10 in FIG. 10C is obtained from the aspect in FIG. 9C, and an anisotropic conductive film 10 in FIG. 10D is obtained from the aspect in FIG. 9D.

Also, for obtaining a two-layer structured insulating film, the manufacturing method according to the present invention preferably further includes the following step (D).

(Step (D))

Figure 9A:
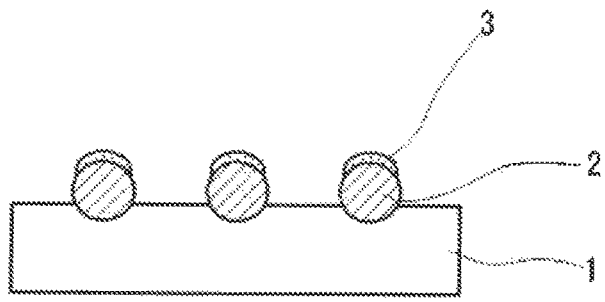
FIG. 9A is a diagram illustrating a step of the manufacturing method of the anisotropic conductive film according to the present invention.
Figure 9B:
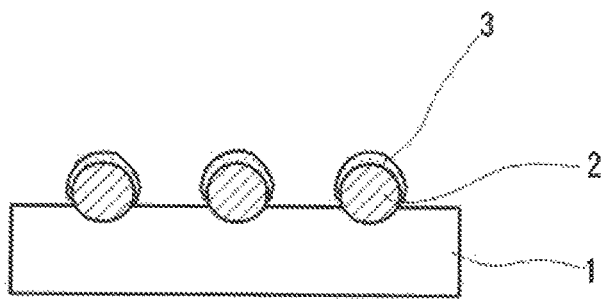
FIG. 9B is a diagram illustrating a step of the manufacturing method of the anisotropic conductive film according to the present invention.
Figure 9C:
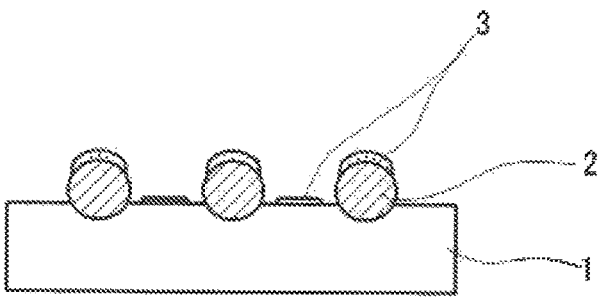
FIG. 9C is a diagram illustrating a step of the manufacturing method of the anisotropic conductive film according to the present invention.
Figure 9D:
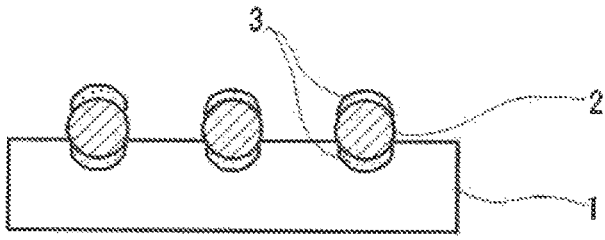
FIG. 9D is a diagram illustrating a step of the manufacturing method of the anisotropic conductive film according to the present invention.
Figure 10A:
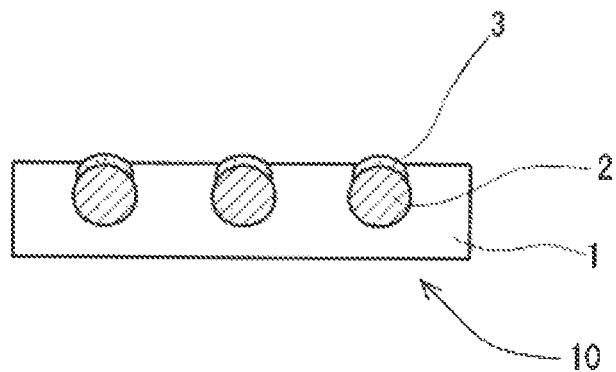
FIG. 10A is a cross-sectional view of an anisotropic conductive film according to the present invention.
Figure 10B:
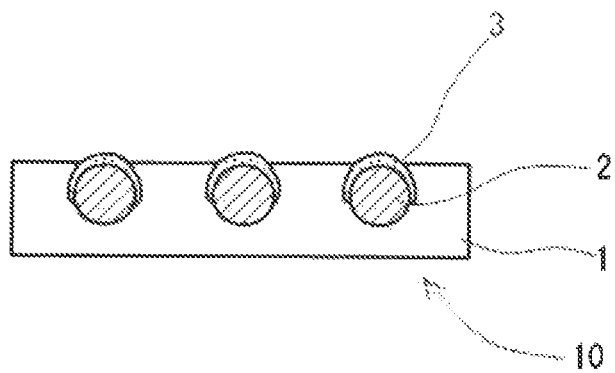
FIG. 10B is a cross-sectional view of an anisotropic conductive film according to the present invention.
Figure 10C:
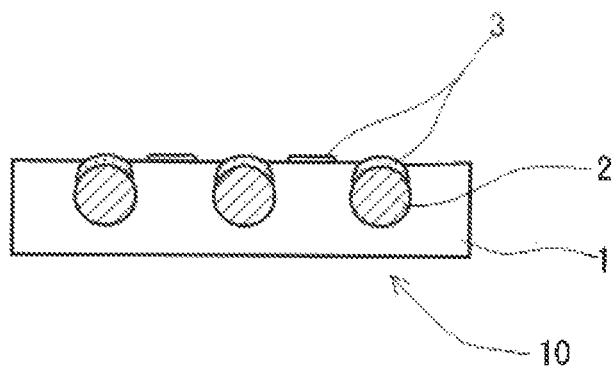
FIG. 10C is a cross-sectional view of an anisotropic conductive film according to the present invention.
Figure 10D:
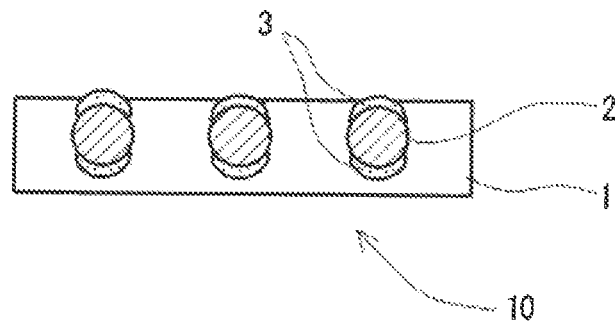
FIG. 10D is a cross-sectional view of an anisotropic conductive film according to the present invention.
Figure 11A:
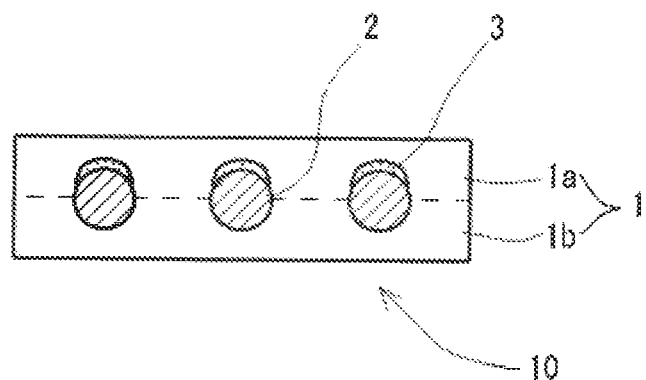
FIG. 11A is a cross-sectional view of an anisotropic conductive film according to the present invention.
Figure 11B:
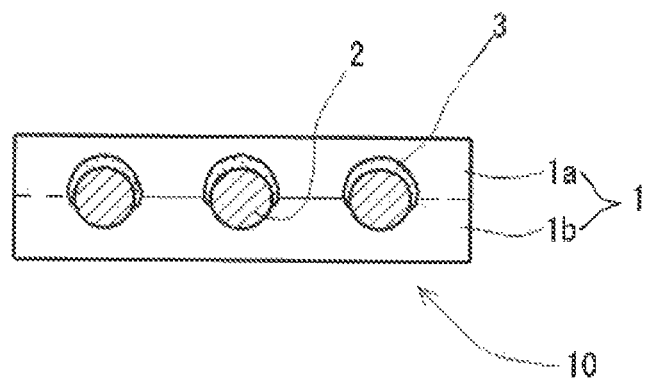
FIG. 11B is a cross-sectional view of an anisotropic conductive film according to the present invention.
Figure 11C:
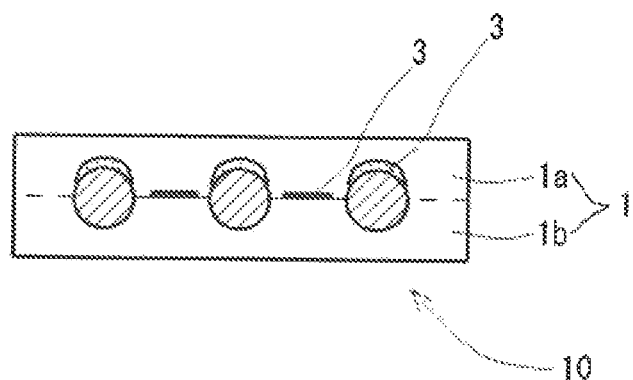
FIG. 11C is a cross-sectional view of an anisotropic conductive film according to the present invention.
Figure 11D:
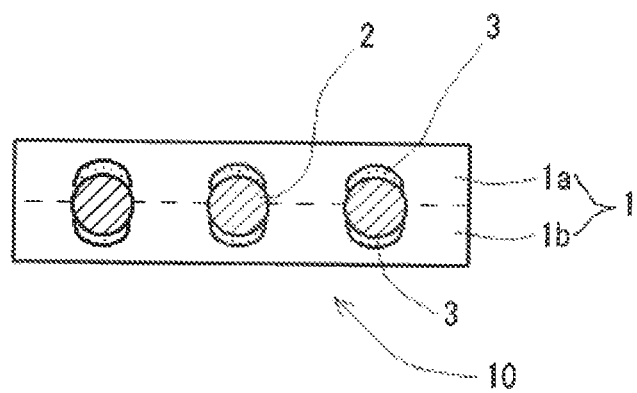
FIG. 11D is a cross-sectional view of an anisotropic conductive film according to the present invention.

That is, by thermocompression-bonding another insulating film on the surface having the transferred metal particles of the insulating film (FIG. 9A to FIG. 9D) to which the metal particles have been transferred, an anisotropic conductive film 10 in FIG. 11A including a two-layer structured insulating film 1 (1a and 1b) is obtained from the aspect in FIG. 9A, an anisotropic conductive film 10 in FIG. 11B including a two-layer structured insulating film 1 (1a and 1b) is obtained from the aspect in FIG. 9B, an anisotropic conductive film 10 in FIG. 11C including a two-layer structured insulating film 1 (1a and 1b) is obtained from the aspect in FIG. 9C, and an anisotropic conductive film 10 in FIG. 11D including a two-layer structured insulating film 1 (1a and 1b) is obtained from the aspect in FIG. 9D.

Also, the anisotropic conductive film according to the present invention can be manufactured by another manufacturing method which includes the following steps (a) to (c).

(Step (a))

Figure 12A:
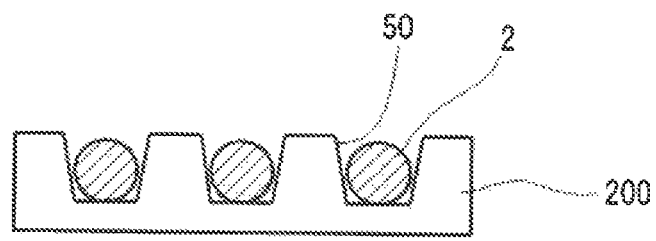
FIG. 12A is a diagram illustrating a step of a manufacturing method of the anisotropic conductive film according to the present invention.

First, as illustrated in FIG. 12A, metal particles 2 are disposed in concave portions 50 of a transfer mold 200 which includes the regularly arranged concave portions 50.

(Step (b))

Figure 12B:
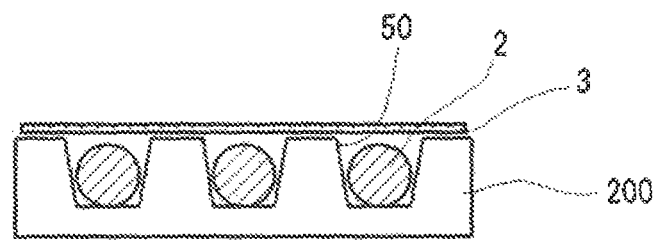
FIG. 12B is a diagram illustrating a step of the manufacturing method of the anisotropic conductive film according to the present invention.

Next, as illustrated in FIG. 12B, a flux 3 is disposed on the transfer mold 200 at the surface having the concave portions in which the metal particles 2 have been disposed.

(Step (c))

Figure 12C:
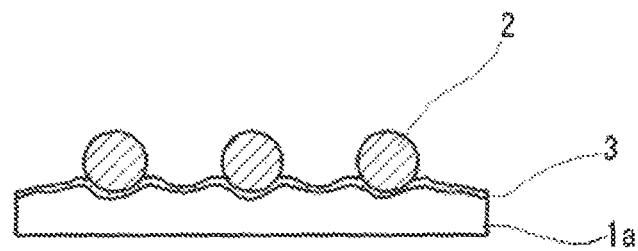
FIG. 12C is a diagram illustrating a step of the manufacturing method of the anisotropic conductive film according to the present invention.

Next, as illustrated in FIG. 12C, the concave portion 50 side of the transfer mold 200 in which the metal particles 2 have been disposed is brought into contact with an insulating film 1a, and the obtained product is pressurized under heating so that the metal particles 2 and the flux 3 are transferred to the insulating film 1a.

(Step (d))

Figure 12D:
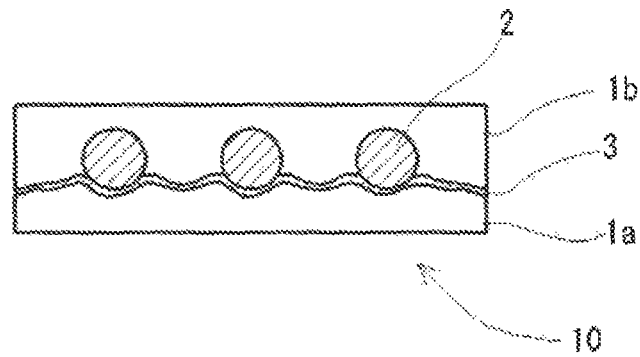
FIG. 12D is a diagram illustrating a step of the manufacturing method of the anisotropic conductive film according to the present invention.

Next, as illustrated in FIG. 12D, another insulating film 1b is thermocompression-bonded on the surface having the transferred metal particles of the insulating film 1a to which the metal particles 2 have been transferred. Accordingly, there can be obtained an anisotropic conductive film 10 in which the flux 3 is disposed between the insulating film 1a and another insulating film 1b which constitute a two-layer structure.

<Connection Structure>

The anisotropic conductive film according to the present invention is useful for manufacturing a connection structure which is obtained by disposing the anisotropic conductive film between a terminal of a first electronic component such as an IC chip and a semiconductor wafer and a terminal of a second electronic component such as a circuit board and a semiconductor wafer, and heating and pressurizing the obtained product to connect the first electronic component and the second electronic component by anisotropic conductive connection. Such a connection structure is also one aspect of the present invention.

EXAMPLES

Hereinafter, the present invention will be specifically described by way of examples.

Example 1

A nickel plate with a thickness of 2 mm was prepared. On the plate, cylindrical convex portions (outer diameter: 25 µm, height: 20 µm) were formed in a square lattice pattern. Thus, a transfer body master was obtained. The distance between the centers of the adjacent convex portions was 40 µm. Accordingly, the density of the convex portions was 625 portions/mm².

A photopolymerizable resin composition which contains 60 parts by mass of a phenoxy resin (YP-50, Nippon Steel & Sumikin Chemical Co., Ltd.), 29 parts by mass of an acrylate resin (M208, Toagosei Co., Ltd.), and 2 parts by mass of a photopolymerization initiator (IRGACURE 184, BASF Japan Ltd.) was applied to the obtained transfer body master such that the dried thickness becomes 30 μm. Then, the obtained product was dried at 80° C. for 5 minutes, and thereafter photo-irradiated at 1000 mJ with a high pressure mercury lamp. Thus, a transfer body was prepared.

A flux (ESR-250T4, Senju Metal Industry Co., Ltd.) diluted with toluene into 5 wt % was applied to the transfer mold peeled from the transfer mold master, using a squeegee, such that the dried flux thickness in the concave portions becomes 1 μm. Then, the flux on the surface of the transfer mold was scraped.

Onto this transfer mold, solder particles with an average particle diameter of 20 μm (solder fine powder, Mitsui Mining & Smelting Co., Ltd.) were dispersed. Thereafter, air blowing was performed to fill the concave portions with the solder particles.

On the transfer mold to which the conductive particles have been attached at the surface having the attached solder particles, there was placed an insulting film with a thickness of 20 μm (a film which contains 60 parts by mass of a phenoxy resin (YP-50, Nippon Steel & Sumikin Chemical Co., Ltd.), 40 parts by mass of an epoxy resin (jER828, Mitsubishi Chemical Corporation), and 2 parts by mass of a cationic curing agent (SI-60L, Sanshin Chemical Industry Co., Ltd.)). The obtained product was pressed at a temperature of 50° C. and a pressure of 0.5 MPa. Thus, the solder particles were transferred to the insulating film.

On the surface having the transferred solder particles of the obtained insulating film, there was superimposed another insulating film with a thickness of 5 μm (a film which contains 60 parts by mass of a phenoxy resin (YP-50, Nippon Steel & Sumikin Chemical Co., Ltd.), 40 parts by mass of an epoxy resin (jER828, Mitsubishi Chemical Corporation), and 2 parts by mass of a cationic curing agent (SI-60L, Sanshin Chemical Industry Co., Ltd.)). The films were laminated at a temperature of 60° C. and a pressure of 2 MPa. Thus an anisotropic conductive film was obtained.

Example 2

A transfer mold similar to that in Example 1 was prepared. Onto this transfer mold, solder particles with an average particle diameter of 20 μm (solder fine powder, Mitsui Mining & Smelting Co., Ltd.) were dispersed. Thereafter, air blowing was performed to fill the concave portions with the solder particles.

A flux (ESR-250T4, Senju Metal Industry Co., Ltd.) diluted with toluene into 20 wt % was applied to the surface of the transfer mold in which the solder particles had been filled, using a squeegee, such that the dried flux thickness becomes 1 μm.

On this flux surface, there was placed an insulting film with a thickness of 20 μm (a film which contains 60 parts by mass of a phenoxy resin (YP-50, Nippon Steel & Sumikin Chemical Co., Ltd.), 40 parts by mass of an epoxy resin (jER828, Mitsubishi Chemical Corporation), and 2 parts by mass of a cationic curing agent (SI-60L, Sanshin Chemical Industry Co., Ltd.)). The obtained product was pressed at a temperature of 50° C. and a pressure of 0.5 MPa. Thus, the solder particles were transferred to the insulating film.

On the surface having the transferred solder particles of the obtained insulating film, there was superimposed another insulting film with a thickness of 5 μm (a film which contains 60 parts by mass of a phenoxy resin (YP-50, Nippon Steel & Sumikin Chemical Co., Ltd.), 40 parts by mass of an epoxy resin (jER828, Mitsubishi Chemical Corporation), and 2 parts by mass of a cationic curing agent (SI-60L, Sanshin Chemical Industry Co., Ltd.)). The layers were laminated at a temperature of 60° C. and a pressure of 2 MPa. Thus, an anisotropic conductive film was obtained.

Comparative Example 1

An anisotropic conductive film was obtained by repeating Example 1, except that the flux is not used.

Example 3

A transfer mold similar to that in Example 1 was prepared, and a flux was disposed on the bottom of concave portions in a similar manner to Example 1. Thereafter, the concave portions were filled with solder particles. A flux (ESR-250T4, Senju Metal Industry Co., Ltd.) diluted with toluene into 5 wt % was applied to the surface of this transfer mold using a squeegee again. Thereafter, an operation similar to Example 1 was repeated thereby to obtain an anisotropic conductive film. The dried coating thickness of the flux was 1 μm on the film interface-side end of the solder particles, and less than 1 μm between the solder particles.

Example 4

An anisotropic conductive film was obtained by repeating Example 1, except that the dilution of the flux (ESR-250T4, Senju Metal Industry Co., Ltd.) with toluene was changed from 5 wt % to 10 wt %, and the dried coating thickness was changed to 2 μm.

Evaluation

With the obtained anisotropic conductive films, a test IC chip on which gold bumps with a size of 100 μm×100 μm×15 μm (height) were formed was anisotropically, conductively connected to a glass epoxy substrate (material properties: FR4) for mounting an IC, under the condition of a temperature of 180° C., a pressure of 40 mPa, and a heating and pressurization time of 20 seconds. Thus, a connection structure was obtained. The obtained connection structures were measured for an initial conduction resistance value, a conduction resistance value after a pressure cooker test (PCT) (test condition: left to stand for 200 hours under the environment of a temperature of 121° C. and a pressure of 2 atm), and a conduction resistance value after a high-temperature and high-humidity bias test (test condition: 50 V applied under the environment of a temperature of 85° C. and a humidity of 85%). The obtained results are shown in Table 1.

For practical use, the initial conduction resistance value needs to be less than 1Ω, and the conduction resistances values after a PCT and a high-temperature and high-humidity bias test need to be less than 15Ω.

TABLE 1

| Conduction Resistance Value (Ω) | Comparative Example 1 | Example 1 | Example 2 | Example 3 | Example 4 |
|---|---|---|---|---|---|
| Initial | 0.1 | 0.1 | 0.1 | 0.1 | 0.1 |
| After PCT | 120 | 5 | 5 | 5 | 5 |
| After High-Temperature And High-Humidity Bias Test | 80 | 5 | 10 | 10 | 7 |

As seen from Table 1, in the anisotropic conductive films according to Examples 1 to 4, in which the solder particles and the flux are disposed to be in contact with each other, favorable results were obtained for all of the evaluation items. On the contrary, in Comparative Example 1, in which the solder particles and the flux are not disposed to be in contact with each other, the conduction resistance values after a PCT test and a high-temperature and high-humidity bias test increased to a large extent.

Example 5

An anisotropic conductive film was obtained by repeating the operation in Example 1, except that a film which contains 60 parts by mass of a phenoxy resin (YP-50, Nippon Steel & Sumikin Chemical Co., Ltd.), 40 parts by mass of an epoxy resin (jER828, Mitsubishi Chemical Corporation), 10 parts by mass of fumed silica (R200, Nippon Aerosil Co., Ltd.), and 2 parts by mass of a cationic curing agent (SI-60L, Sanshin Chemical Industry Co., Ltd.) is used as the insulating film with a thickness of 20 μm to which the solder particles are to be transferred. In the obtained anisotropic conductive film, favorable results were obtained for all of the evaluation items, similarly to the anisotropic conductive film according to Example 1.

INDUSTRIAL APPLICABILITY

The anisotropic conductive film according to the present invention can suppress the occurrence of a short in a connection structure obtained by anisotropic conductive connection with the anisotropic conductive film, and also can lower not only the initial conduction resistance value but also the conduction resistance values after a PCT and a high-temperature and high-humidity bias test. Therefore, the anisotropic conductive film according to the present invention is useful when, for example, mounting an IC chip on a circuit board.

REFERENCE SIGNS LIST 1, 1a, 1b insulating film
2 metal particle
2a, 2b ends of metal particle on front surface side or rear surface side of anisotropic conductive film
3 flux
10 anisotropic conductive film
50 concave portion of transfer mold
100, 200 transfer mold

The invention claimed is:

1. A method of manufacturing an anisotropic conductive film, the anisotropic conductive film comprising: metal particles in an insulating film, wherein the metal particles are regularly arranged as viewed in a plan view, and a flux is disposed to be in contact with, or in proximity to, at least one surface of the metal particles on a front surface side of the anisotropic conductive film and on a rear surface side of the anisotropic conductive film, and the flux is disposed to be in proximity to the at least one surface of the metal particles if a distance of less than 2 μm is between the flux and the at least one surface of the metal particles, the method comprising:

(A) disposing a flux on at least a bottom of concave portions of a transfer mold which has the concave portions regularly arranged;
(B) disposing metal particles in the concave portions in which the flux has been disposed; and
(C) bringing an insulating film into contact with the transfer mold, in which the metal particles have been disposed, from a side of the concave portions, and heating and pressurizing them to transfer the metal particles to the insulating film.

2. The method according to claim 1, further comprising:
(D) thermocompression-bonding another insulating film on the surface, having the transferred metal particles, of the insulating film to which the metal particles have been transferred.

3. A method of manufacturing an anisotropic conductive film, the anisotropic conductive film comprising: metal particles in an insulating film, wherein the metal particles are regularly arranged as viewed in a plan view, and a flux is disposed to be in contact with, or in proximity to, at least one surface of the metal particles on a front surface side of the anisotropic conductive film and on a rear surface side of the anisotropic conductive film, and the flux is disposed to be in proximity to the at least one surface of the metal particles if a distance of less than 2 μm is between the flux and the at least one surface of the metal particles, the method comprising:

(a) disposing metal particles in concave portions of a transfer mold which has the concave portions regularly arranged;
(b) disposing a flux on the transfer mold at a surface having the concave portions in which the metal particles have been disposed;
(c) bringing an insulating film into contact with the transfer mold at the surface having the disposed flux, and heating and pressurizing them to transfer the metal particles to the insulating film; and
(d) thermocompression-bonding another insulating film on the surface having the transferred metal particles of the insulating film to which the metal particles have been transferred.

* * * * *